US007307001B2

(12) United States Patent
Lin et al.

(10) Patent No.: US 7,307,001 B2
(45) Date of Patent: Dec. 11, 2007

(54) WAFER REPAIR METHOD USING DIRECT-WRITING

(75) Inventors: Chin-Hsiang Lin, Hsin-Chu (TW); Burn Jeng Lin, Hsin-Chu (TW); Tsai-Sheng Gau, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 275 days.

(21) Appl. No.: 11/029,992

(22) Filed: Jan. 5, 2005

(65) Prior Publication Data

US 2006/0148109 A1 Jul. 6, 2006

(51) Int. Cl.
*H01L 21/76* (2006.01)
(52) U.S. Cl. .................. 438/401; 257/E21.508
(58) Field of Classification Search ................ 438/478, 438/184, 193, 195–198, 200, 218, 237, 165, 438/294, 308, 337, 353, 378, 401, 6–8, 210, 438/104, 107–114, 118, 121–123, 128–129, 438/135, 142, 145, 149, 151, 157, 176, 612, 438/706, 485, 513, 710, 717; 382/144
See application file for complete search history.

(56) References Cited

U.S. PATENT DOCUMENTS

| 5,801,088 A  * | 9/1998  | Gardner et al. ............. 438/585 |
| 6,205,239 B1   | 3/2001  | Lin et al. |
| 6,272,236 B1 * | 8/2001  | Pierrat et al. ................ 382/144 |
| 6,931,619 B2 * | 8/2005  | Buxbaum et al. ............. 716/21 |
| 6,967,168 B2 * | 11/2005 | Stearns et al. ............. 438/706 |
| 2003/0109126 A1* | 6/2003 | Terasawa et al. ........... 438/612 |
| 2005/0176174 A1* | 8/2005 | Leedy ......................... 438/107 |
| 2005/0221577 A1* | 10/2005 | Li et al. ...................... 438/401 |

\* cited by examiner

*Primary Examiner*—Michael Lebentritt
*Assistant Examiner*—Andre' Stevenson
(74) *Attorney, Agent, or Firm*—Haynes Boone, LLP

(57) ABSTRACT

A method of wafer repairing comprises identifying locations and patterns of defective regions in a semiconductor wafer; communicating the locations and patterns of defective regions to a direct-writing tool; forming a photoresist layer on the semiconductor wafer; locally exposing the photoresist layer within the defective regions using an energy beam; developing the photoresist layer on the semiconductor wafer; and wafer-processing the semiconductor wafer under the photoresist layer after exposing and developing.

21 Claims, 5 Drawing Sheets

WAFER REPAIR METHOD USING DIRECT-WRITING

BACKGROUND

The fabrication of integrated circuits (IC) implements various patterning processes in the semiconductor wafer to define regions to be etched. Defects may be induced during patterning and/or subsequent etching. Such defects may be identified in an after-etching-inspection (AEI) stage. For example, a region to be etched can be missed or only partially etched. These patterning defects can reduce manufacturing yield and/or raise quality and reliability issues.

In current practice, a defect limit is established, and a wafer having patterning defects in excess of this limit may be scrapped while a wafer having fewer defects may proceed through fabrication. It is important to set the limit at the right amount to balance the loss of scrapping an entire wafer vs. the extra expense of continuing to fabricate a wafer that will have a relatively high number of die with defects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
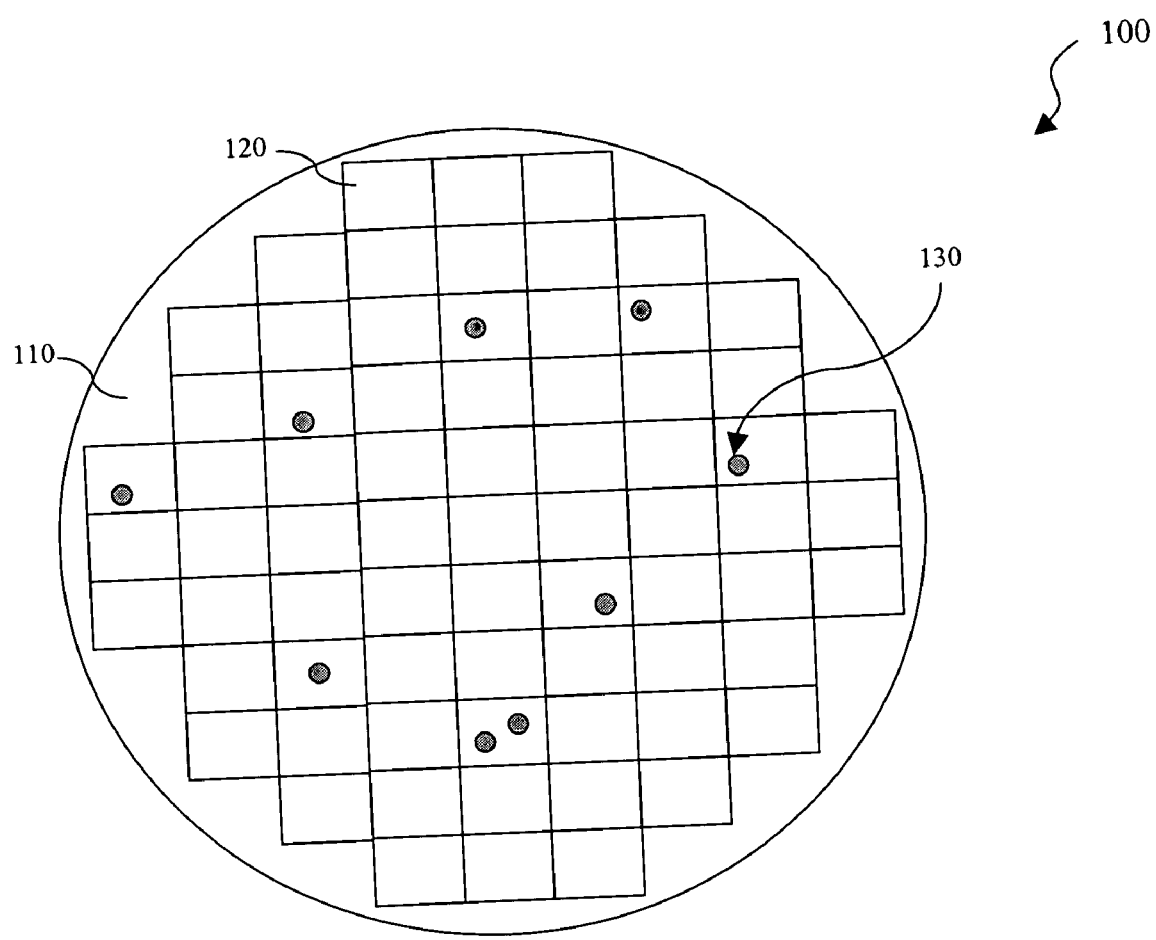
FIG. 1 is a top view of semiconductor wafer having patterning defects.

The present disclosure relates generally to a semiconductor manufacturing and, more specifically, to a semiconductor wafer repairing by direct-writing.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a top view of an embodiment of a semiconductor wafer (wafer) 100 having a plurality of patterning defects. The wafer comprises a substrate 110. The substrate 110 may be an elementary semiconductor such as silicon and germanium. The substrate 110 may also comprise a compound semiconductor such as gallium arsenic, indium arsenide, and indium phosphide. The substrate 110 may comprise an alloy semiconductor such as silicon germanium, silicon germanium carbide, gallium arsenic phosphide, and gallium indium phosphide.

The wafer 100 may be partitioned into a plurality of die 120, each having an integrated circuit formed on the substrate and being separated from others by scribing lines.

During manufacturing stage, the wafer 100 may be processed using photolithography processing and wafer processing including doping, etching, liftoff, and/or other proper processing. In one example, the wafer under a patterned photoresist may be doped with impurities by ion implantation to form a patterned dopant profile in the substrate 110. In another example, the wafer may be coated with a film and then etched under a patterned photoresist to form a patterned film on the substrate. In another example, the wafer under a patterned photoresist may be etched to form a trench pattern in the substrate.

An exemplary photolithography processing may include photoresist coating, soft baking, mask aligning, exposing, post-exposure baking, developing photoresist, hard baking, (other processing under patterned photoresist such as etching and doping,) and photoresist stripping. Photolithography patterning may also be implemented or replaced by other suitable methods such as maskless photolithography, electron-beam writing, ion-beam writing, optical writing, and molecular imprint.

A defect (or a plurality of defects) 130 may be induced during the above-described patterning process. The defect may be a mis-processed region such as an etched region that was not supposed to be etched under the patterned photoresist, or, a region to be etched but was missed or partially etched. The defect 130 may be induced during photolithography processing or during wafer-processing including etching, implantation, and/or liftoff.

Figure 4:
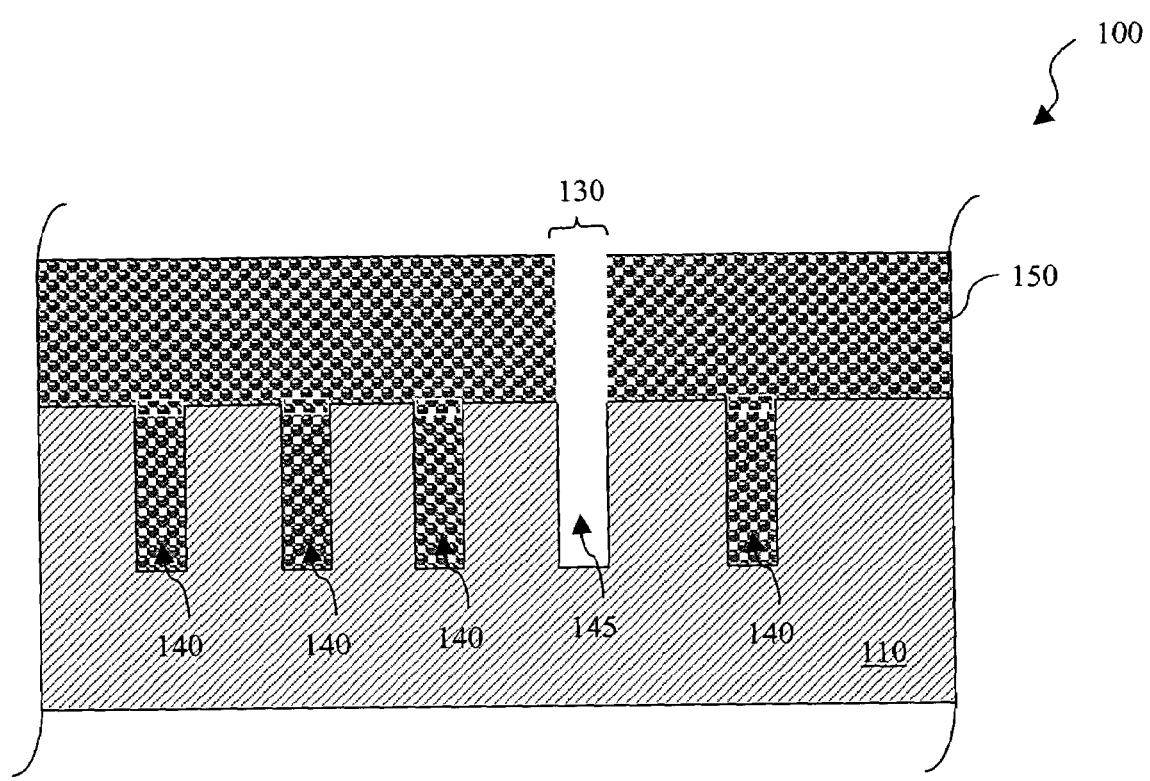
Figure 5:
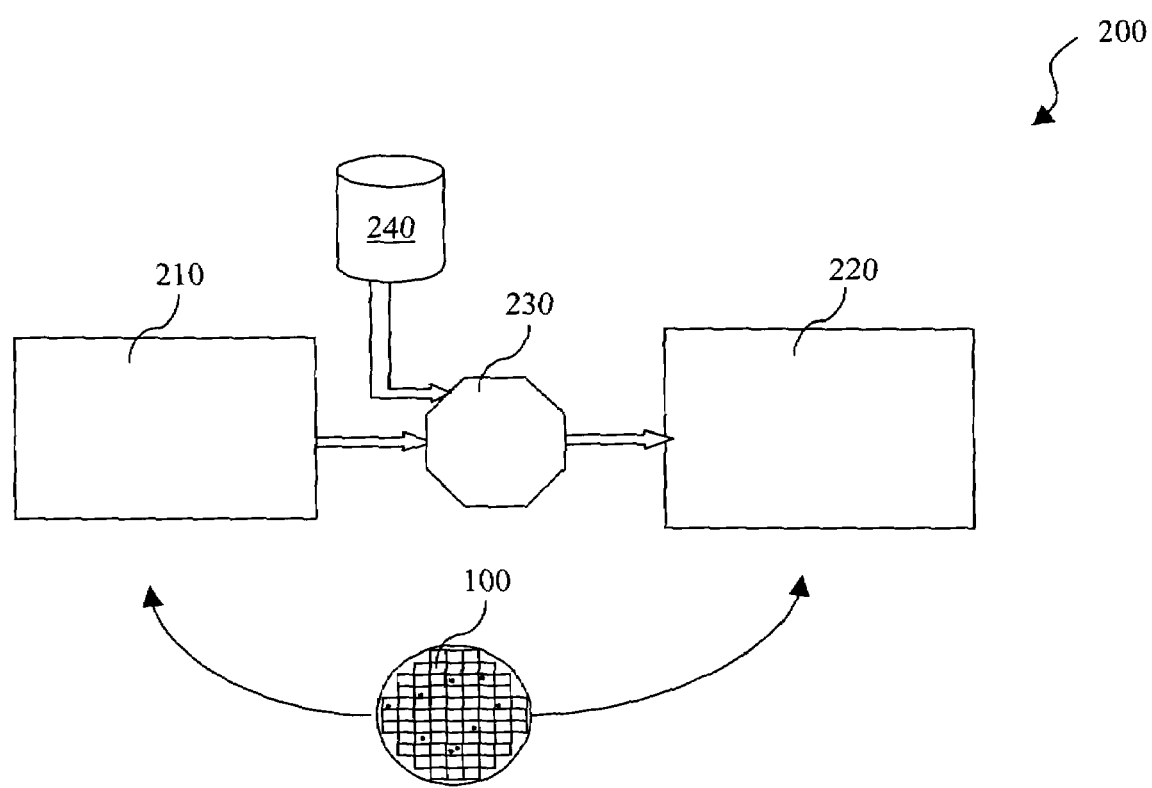
FIG. 5 is a block diagram of a system for implementing one or more embodiments of the present disclosure.

Referring to FIG. 5, the wafer 100 can be repaired, according to one embodiment, using a wafer repair system 200. The wafer repair system 200 will be generally described with reference to FIG. 5, and an example operation of the wafer repair system will be further discussed in continuation of the example of FIGS. 2-4.

The wafer repair system 200, comprises an inspection tool 210, a direct-writing tool 220, an information processing module 230 configured to communicate between the inspection tool, and a direct-writing tool, and a database 240.

The inspection tool 210 may comprise a scanning electron microscope (SEM), scanning Auger microscope (SAM), and/or optical microscope. The inspection tool 210 may be other proper tool which is capable of identifying various defects. The inspection tool 210 can scan the wafer 100 to create a wafer image, record the wafer image, and/or pass the wafer image to the information processing module 230 or the database 240.

The direct-writing tool 220 can locally expose the photoresist layer coated on the wafer using an energy beam. The energy beam may comprise an electron beam, an ion beam, or an optical beam. An exemplary optical beam may have a wavelength ranging from about 10 nm to about 250 nm. The direct-writing tool 220 may include a proper stage with alignment module to hold and manipulate the wafer for proper exposing.

The information processing module 230 may comprise a data bus linked to the inspection tool 210, direct-writing tool 220, and database 240. The information processing module 230 may further comprise both hardware and software to take a wafer image from the inspection tool 210, extract a reference image from the database 240 or the inspection tool 210, compare the wafer image with the reference image, generate data of locations of defective regions, and pass the data of locations of defective regions to the direct-writing tool 220. The information processing module 230 may need further convert the data of locations of defective regions into a format that is accessible to the direct-writing tool 220. In another embodiment, at least certain functions of the information processing module 230 may be realized in the inspection tool 210. In another embodiment, the information processing module 230 may be integrated, or partially integrated with the inspection tool 210.

The database 240 may comprise a plurality of sub-databases and may be a part of a central database of the semiconductor manufacturing. The database 240 may comprises at least layout data of semiconductor products such that a reference image of the wafer may be extracted from.

Figure 2:
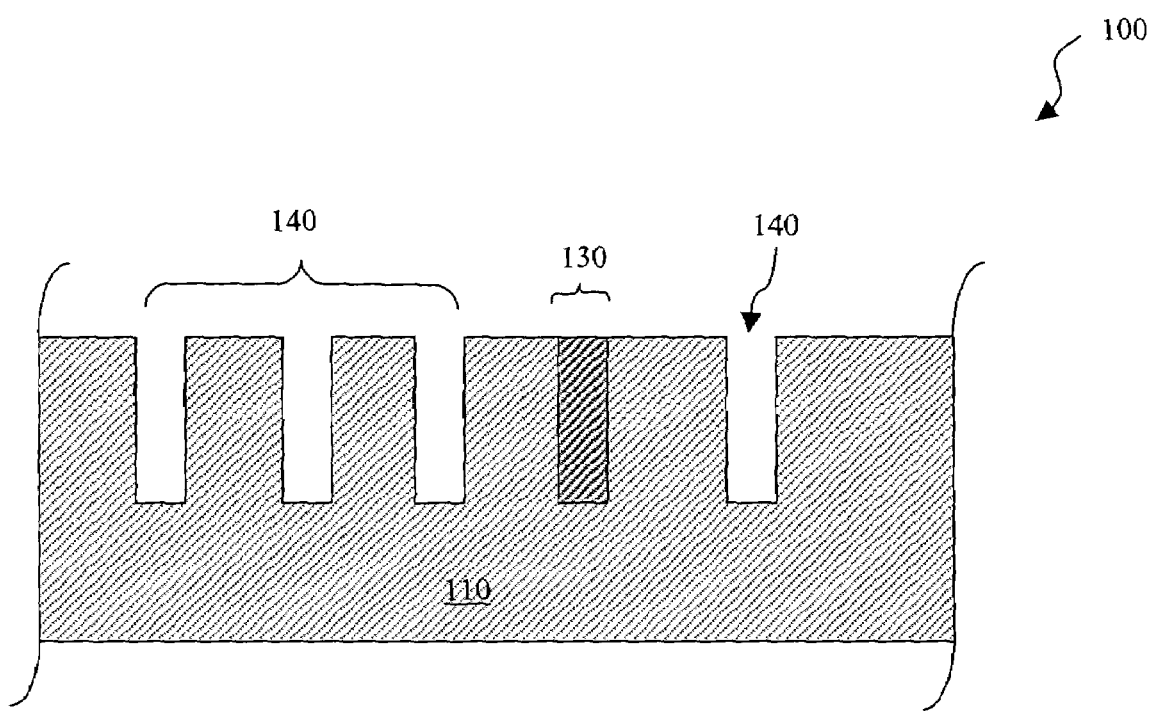
FIGS. 2 through 4 are simplified sectional views of a semiconductor device at selected stages of wafer-repairing according to the present disclosure.

For the sake of example, operation of the wafer repair system 200 will be further described with reference to FIGS. 2-4. Referring specifically to FIG. 2, the wafer 100 may include a plurality of contact holes 140 formed with a sequences of processes including photolithography processing and etching. The exemplary defective region 130 may be an area wherein an expected contact hole is missing.

To initiate a wafer repair process, the wafer 100 is first inspected by an inspection process. The inspection process may be executed after the completion of the wafer-processing. For example, the wafer 100 may be inspected after the completion of the contact hole etching process, referred to as after-etching-inspection (AEI). During the inspection process, the wafer 100 is scanned by the inspection tool 210 to obtain a wafer image, including in one embodiment, scanning from die to die. The wafer image comprises wafer-processing information, such as contact-hole, line, space, alignment mark, and/or combinations thereof. The wafer image may be obtained after developing, etching, implanting, or other proper processing step.

The wafer image is compared with a reference image stored in the database 240 containing a desired image for the wafer, including the missing contact-hole (region 130) in the information processing module 230. In another embodiment, the reference image may be a scanned image of another die having no defective region. The comparing process may generate data of locations of defective regions 130 in the wafer 100. The information of the defective regions may be evaluated by a predefined criteria, to determine if the wafer 100 is to be scrapped, to be repaired, or to be moved on. If the wafer is to be repaired, the locations of the defective regions 130 may be further converted into a format accessible by the direct-writing tool 220. The direct-writing tool 220 can perform local exposure processing to a photoresist-coated wafer, referred to as a direct-writing exposure.

Figure 3:
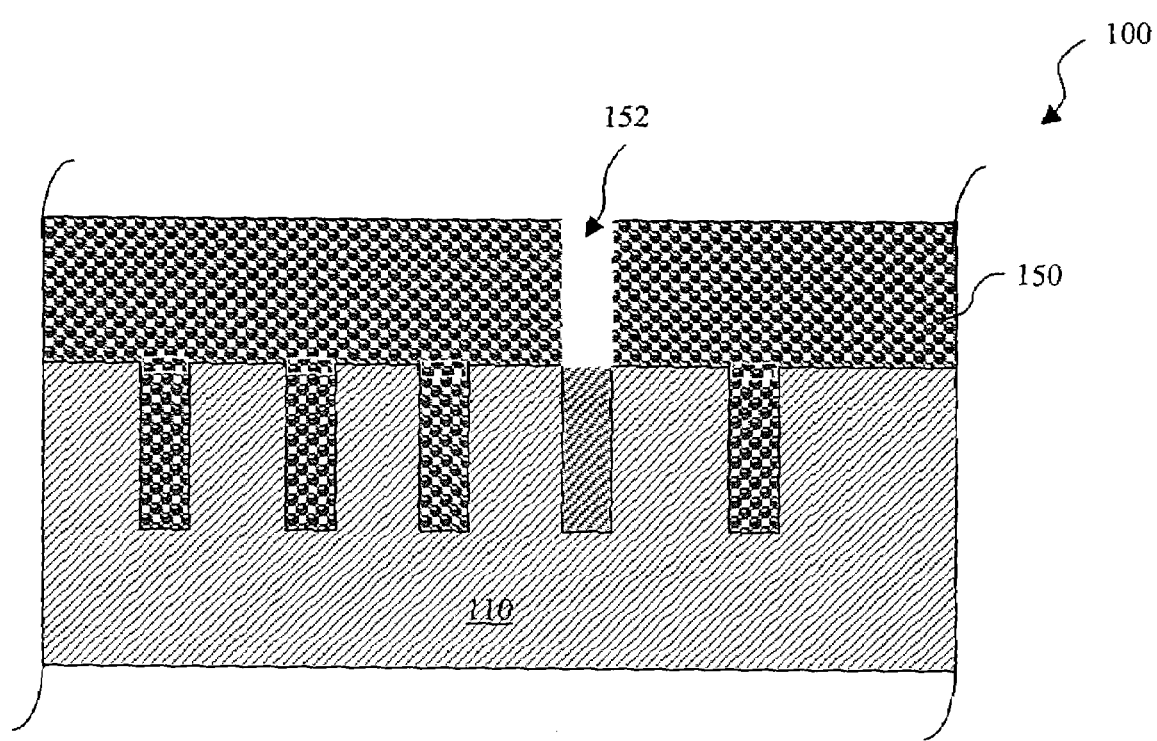

Referring to FIG. 3, a photoresist layer 150 may be coated onto the wafer 100 after the wafer inspection. The photoresist layer 150 can be a positive type or an negative type. The wafer 100 may be cleaned before and/or soft-baked after the photoresist-coating. The wafer 100 is then moved to the direct-writing tool 220 for exposure processing. The direct-writing tool 220 may comprise an energy beam such as photon beam, electron-beam (E-beam), or ion beam. Under the control or guidance of the information processing module 230, the energy beam may be focused and directed to a first spot of the photoresist layer coated on the wafer according to the data of locations of defective regions and the reference image. The energy beam may be directed to the first spot for a period of time according to photoresist type, energy beam type, and energy density. The energy beam is then directed to a second spot and repeat the same exposure processing. The energy beam may repeat directing and exposure processing to all spots to be exposed according to the data of locations and patterns of defective regions and the reference image. The directing and exposing processing may be implemented by continuously writing to each defective region. In current example illustrated in FIG. 3, the photoresist layer 150 within the defective region 130 may be exposed by the direct-writing method, resulting in an exposed photoresist area corresponding to the missed contact hole.

The wafer 100 after direct-writing exposure may be further processed including the steps of post-exposure baking, developing, and hard-baking. After developing the exposed photoresist by the direct-writing method, the photoresist 150 may have a plurality of openings each corresponding to at least a portion of one defective regions. In the current example, the photoresist 150 comprises an opening 152 corresponding to the missed contact hole in the defective region 130.

Referring to FIG. 4, the wafer 100, having the patterned photoresist layer 150, is then transferred for a wafer-processing including etching, ion implantation, liftoff, and other proper process. The wafer-processing may be same to the processing used to form the original pattern in which the defective regions were induced therewith. In the current example, an etching process is implemented to from a contact hole 145 which was missed during the original patterning process. The etching process may include dry etching, wet etching, and/or reactive ion etching (RIE). The photoresist may be then stripped by a proper method such as wet stripping or plasma ashing. Since the exposure processing during repair procedure adopts direct-writing method, a costly repair mask is eliminated. Furthermore, the direct-writing processing in the repair procedure may also be very effective in terms of time and cost because the area of the defective regions are usually much less than the total area of the wafer.

The wafer 100 now completes its repair and may be sent on to the next process in the normal processing flow. The wafer 100 may be alternatively sent to another inspection and may repeat the same repair procedure if defective regions are caught and beyond a predefined criteria. The same wafer repair procedure may also be applied to the wafer as many times as necessary and may be applied to any patterning process including ion implantation and liftoff. The expose processing during the wafer repair may also be implemented or replaced by other suitable methods such as an optical exposure using a maskless photolithography system.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of wafer repairing, comprising:
   identifying locations and patterns of one or more defective regions in a semiconductor wafer;
   communicating the locations and patterns of defective regions to a direct-writing tool, wherein communicating the locations and patterns of defective regions further comprises providing the locations and patterns of defective regions in a data format readable by a direct-writing tool;
   locally exposing a photoresist within the defective regions using an energy beam;
   developing the exposed photoresist; and processing the semiconductor wafer using the exposed photoresist.

2. The method of claim 1 wherein processing the semiconductor wafer comprises a process selected from the group consisting of etching, ion implanting, and liftoff.

3. The method of claim 1 wherein processing the semiconductor wafer includes etching the semiconductor wafer using a process selected from a group consisting of dry etching, wet etching, reactive ion etching, and combinations thereof.

4. The method of claim 1 wherein the energy beam comprises an energy quantum selected from a group consisting of electron, photon, and ion.

5. The method of claim 1 wherein developing comprises at least one baking process.

6. The method of claim 1 wherein communicating the locations and patterns of defective regions comprises comparing a wafer image with a reference image.

7. The method of claim 6 wherein the wafer image comprises an after-etching-inspection wafer image.

8. The method of claim 6 wherein the wafer image comprises an after-developing-inspection image.

9. The method of claim 6 wherein the reference image comprises an image of another die of the semiconductor wafer.

10. The method of claim 6 wherein the reference image is extracted from a database.

11. The method of claim 6 wherein the wafer image comprises a pattern selected from the group consisting of contact hole, line, space, alignment mark, and combinations thereof.

12. The method of claim 1 wherein locally exposing the defective regions comprises locally exposing one of the defective regions until the defective regions are exhausted.

13. The method of claim 12 wherein locally exposing one of the defective regions comprises
    directing the energy beam to one of the defective regions according to the date of the location of defective regions; and
    writing in one of the defective regions according to the formatted data.

14. The method of claim 1 wherein the defective regions comprising regions wherein an aimed process is missing or partially done.

15. The method of claim 1 wherein the photoresist is a positive photoresist layer.

16. The method of claim 1 wherein the photoresist comprises a multi-layer structure.

17. A method of wafer repairing, comprising:
    identifying locations and patterns of defective regions in a semiconductor wafer;
    locally exposing a photoresist layer, formed on the semiconductor wafer, within the defective regions; and
    developing the photoresist layer.

18. The method of claim 17 further comprising wafer-processing the semiconductor wafer under the photoresist layer after exposing and developing.

19. The method of claim 17 wherein locally exposing comprises direct writing using an energy beam.

20. The method of claim 19 wherein the energy beam is selected from the group consisting of an electron beam, an ion beam, and an optical beam.

21. A system of wafer repairing, comprising:
    identifying locations and patterns of one or more defective regions in a semiconductor wafer;
    communicating the locations and patterns of defective regions to a direct-writing tool, including comparing a wafer image with a reference image, wherein the wafer image comprises at least one of an after-etching-inspection wafer image and an after-developing-inspection image, and wherein the reference image comprises at least one of an image of a die of the semiconductor wafer and an image extracted from a database;
    locally exposing a photoresist within the defective regions using one of an electron beam, a photon beam and an ion beam directed to each individual one of the defective regions according to data of the location of defective regions and subsequently writing in the defective regions according to the data, wherein the photoresist comprises at least one of a positive photoresist layer and a multi-layer structure;
    developing the exposed photoresist, including baking the exposed photoresist; and
    processing the semiconductor wafer using the exposed and developed photoresist via at least one of dry etching, wet etching, reactive ion etching, ion implanting, and liftoff.

\* \* \* \* \*